United States Patent
Lan et al.

(10) Patent No.: US 9,783,408 B2
(45) Date of Patent: Oct. 10, 2017

(54) STRUCTURE OF MEMS ELECTROACOUSTIC TRANSDUCER

(71) Applicant: UNITED MICROELECTRONICS CORP., Hsin-Chu (TW)

(72) Inventors: Bang-Chiang Lan, Taipei (TW); Ming-I Wang, New Taipei (TW); Li-Hsun Ho, Hsinchu County (TW); Hui-Min Wu, Hsinchu County (TW); Min Chen, New Taipei (TW); Chien-Hsin Huang, Taichung (TW)

(73) Assignee: UNITED MICROELECTRONICS CORP., Hsin-chu (TW)

( * ) Notice: Subject to any disclaimer, the term of this patent is extended or adjusted under 35 U.S.C. 154(b) by 0 days.

(21) Appl. No.: 14/307,512

(22) Filed: Jun. 18, 2014

(65) Prior Publication Data

US 2014/0291787 A1    Oct. 2, 2014

Related U.S. Application Data

(62) Division of application No. 12/233,919, filed on Sep. 19, 2008, now Pat. No. 8,798,291.

(51) Int. Cl.
*H04R 7/00*     (2006.01)
*B81B 3/00*     (2006.01)
(Continued)

(52) U.S. Cl.
CPC ............ *B81B 3/0021* (2013.01); *H04R 3/00* (2013.01); *H04R 7/00* (2013.01); *H04R 19/005* (2013.01); *H04R 31/00* (2013.01); *B81B 2201/0271* (2013.01); *H04R 2499/11* (2013.01); *Y10T 29/49002* (2015.01)

(58) Field of Classification Search
CPC .... B81B 3/00; H04R 7/00; H04R 7/04; H04R 7/08; H04R 2207/00; H04R 7/16; H04R 31/00; H04R 2201/00; H04R 2201/003; H04R 2231/00; H04R 2307/00;
(Continued)

(56) References Cited

U.S. PATENT DOCUMENTS 6,552,404 B1    4/2003   Hynes
6,936,524 B2    8/2005   Zhu
(Continued)

FOREIGN PATENT DOCUMENTS

TW        I262735      9/2006
TW        I268115      12/2006
TW        200714116    4/2007

OTHER PUBLICATIONS

Rombach et al, WO 2007/112743 A1, Oct. 11, 2007.*
Langereis et al., WO 2007/029134 A2, Mar. 15, 2007.*

*Primary Examiner* — Daniel Whalen
*Assistant Examiner* — Suberr Chi
(74) *Attorney, Agent, or Firm* — Winston Hsu

(57) ABSTRACT

A structure of micro-electro-mechanical systems (MEMS) electroacoustic transducer is disclosed. The MEMS electroacoustic transducer includes a substrate having a MEMS device region, a diaphragm having openings and disposed in the MEMS device region, a silicon material layer disposed on the diaphragm and sealing the diaphragm, and a conductive pattern disposed beneath the diaphragm in the MEMS device region. Preferably, a first cavity is also formed between the diaphragm and the substrate.

8 Claims, 7 Drawing Sheets

(51) Int. Cl.
*H04R 19/00* (2006.01)
*H04R 31/00* (2006.01)
*H04R 3/00* (2006.01)

(58) Field of Classification Search
CPC ........ H04R 1/283; H04R 25/00; H04R 11/00;
F04B 43/043; F16J 3/00
USPC ....... 381/150, 163, 348, 174, 176, 178, 191,
381/423
See application file for complete search history.

(56) References Cited

U.S. PATENT DOCUMENTS

| | | |
|---|---|---|
| 6,943,448 B2 | 9/2005 | Gabriel |
| 7,202,101 B2 | 4/2007 | Gabriel |
| 7,362,873 B2 | 4/2008 | Pedersen |
| 7,898,081 B2 | 3/2011 | Lan |
| 2005/0095813 A1 | 5/2005 | Zhu |
| 2005/0095814 A1 | 5/2005 | Zhu |
| 2007/0003082 A1 | 1/2007 | Pedersen |
| 2009/0285419 A1 | 11/2009 | Shih |
| 2010/0052179 A1 | 3/2010 | Lan |

\* cited by examiner

STRUCTURE OF MEMS ELECTROACOUSTIC TRANSDUCER

CROSS REFERENCE TO RELATED APPLICATIONS

This application is a division of U.S. application Ser. No. 12/233,919 filed Sep. 19, 2008, and incorporated herein by reference in its entirety.

BACKGROUND OF THE INVENTION

1. Field of the Invention

The present invention generally relates to a micro-electro-mechanical systems (MEMS) structure, in particular, to a structure of MEMS electroacoustic transducer.

2. Description of the Prior Art

Electroacoustic transducers are capable of converting acoustic waves into electrical signals or converting electrical signals into acoustic waves by the use of diaphragms, so as to serve as the microphones or speakers. The electroacoustic transducers have wide applications, such as in mobile phone, digital camera, hands free phone, and notebook computer products in the computer communication industry, or in the medical instruments such as hearing aids and cochlear implant products.

Along with the rapid development of the electronic industry and progress of the semiconductor process and packaging technique, the electroacoustic transducer products are designed in the trend of multifunction. In order to satisfy the demands for "light, thin, short, small," power-saving, and low price, it is the trend for the electroacoustic transducers to develop micro-electroacoustic transducers that may be integrated with chips fabricated through the semiconductor process.

Micro-electro-mechanical systems (MEMS) electroacoustic transducers are formed by designing the mechanical devices and electronic devices on chips through the integrated circuit technique. By way of example, in consideration of the current development, the MEMS microphones are designed based on the capacitive principles. The basic construction of a capacitive microphone mainly includes a electrode fixed on a soft diaphragm and a rigid back plate respectively, and a backside cavity formed between the diaphragm and the back plate, so as to achieve the freely vibration along with the sounds. The electric field between the vibrated diaphragm and the back plate varies, thus producing the electronic signals transmitted on the circuits.

Generally speaking, after the backside cavity is formed, a polymer layer is formed to seal the diaphragm, so as to create the air-tight environment. However, the material of the polymer layer is overly soft, which causes the problem that the sensitivity of the electroacoustic transducer is unsatisfactory. Furthermore, in practical operation, the method of sealing the diaphragm with the polymer material has complex procedures, and the quality of the polymer layer is not easy to control.

SUMMARY OF THE INVENTION

Accordingly, the present invention is directed to provide a structure of micro-electro-mechanical systems (MEMS) electroacoustic transducer, which can effectively improve the sensitivity of the MEMS electroacoustic transducer.

The present invention is also directed to provide a fabricating method of a structure of MEMS electroacoustic transducer, capable of fabricating the sealing layer of good quality.

The present invention is further directed to provide a fabricating method of a structure of MEMS electroacoustic transducer, which can be easily integrated with the current process, thus simplifying the process.

The present invention provides a structure of MEMS electroacoustic transducer, which includes a substrate, a diaphragm, a silicon material layer, and a conductive pattern. The substrate includes an MEMS device region. The diaphragm has openings, and is disposed in the MEMS device region. A first cavity is formed between the diaphragm and the substrate. The silicon material layer is disposed on the diaphragm and seals the diaphragm. The conductive pattern is disposed beneath the diaphragm in the MEMS device region.

In the structure of MEMS electroacoustic transducer according to an embodiment of the present invention, a material of the diaphragm is, for example, a metal material.

In the structure of MEMS electroacoustic transducer according to an embodiment of the present invention, the diaphragm is in a shape of, for example, net.

In the structure of MEMS electroacoustic transducer according to an embodiment of the present invention, a material of the silicon material layer is, for example, amorphous silicon or polysilicon.

In the structure of MEMS electroacoustic transducer according to an embodiment of the present invention, the structure further includes a vent hole disposed in the substrate in the MEMS device region.

In the structure of MEMS electroacoustic transducer according to an embodiment of the present invention, the structure further includes a vent hole region being in communication with the MEMS device region.

In the structure of MEMS electroacoustic transducer according to an embodiment of the present invention, the structure further includes a vent hole layer having a vent hole and disposed in the vent hole region. A second cavity is formed between the vent hole layer and the substrate, and the second cavity is in communication with the first cavity.

In the structure of MEMS electroacoustic transducer according to an embodiment of the present invention, a material of the vent hole layer is, for example, a metal material.

In the structure of MEMS electroacoustic transducer according to an embodiment of the present invention, the structure further includes a protection ring structure disposed at at least one side of the MEMS device region.

The present invention provides a fabricating method of a structure of MEMS electroacoustic transducer, which includes the following steps. First, a substrate including a circuit region and an MEMS device region is provided. Then, a first metal interconnect structure is formed on a front side of the substrate in the circuit region. At the same time, a first dielectric layer structure located at the front side of the substrate, a conductive pattern located in the first dielectric layer structure, and a diaphragm located on the first dielectric layer structure and having openings are formed in the MEMS device region. After that, a sealing layer is formed on the diaphragm and seals the diaphragm. Next, a second metal interconnect structure is formed on the first metal interconnect structure. At the same time, a second dielectric layer structure is formed on the sealing layer in the MEMS device region. Thereafter, a first hard mask layer is formed on the second metal interconnect structure. Then, a second hard mask layer is formed on a back side of the substrate in the circuit region. Afterwards, a vent hole is formed in the substrate in the MEMS device region. After that, the first dielectric layer structure and the second dielectric layer structure are removed by the use of the first hard mask layer and the second hard mask layer as a mask.

In the fabricating method of a structure of MEMS electroacoustic transducer according to an embodiment of the present invention, a material of the sealing layer is, for example, amorphous silicon or polysilicon.

In the fabricating method of a structure of MEMS electroacoustic transducer according to an embodiment of the present invention, a material of the first hard mask layer is, for example, a silicon material or a metal material.

In the fabricating method of a structure of MEMS electroacoustic transducer according to an embodiment of the present invention, a material of the second hard mask layer is, for example, a metal material.

In the fabricating method of a structure of MEMS electroacoustic transducer according to an embodiment of the present invention, a forming method of the vent hole includes, for example, removing a portion of the substrate from the back side of the substrate.

In the fabricating method of a structure of MEMS electroacoustic transducer according to an embodiment of the present invention, when forming the first metal interconnect structure and the second metal interconnect structure, the method further includes forming a protection ring structure between the circuit region and the MEMS device region.

The present invention provides another fabricating method of a structure of MEMS electroacoustic transducer, which includes the following steps. First, a substrate including a circuit region, an MEMS device region, and a vent hole region is provided. Then, a first metal interconnect structure is formed on the substrate in the circuit region. At the same time, a first dielectric layer structure located on the substrate, a conductive pattern located in the first dielectric layer structure, and a diaphragm located on the first dielectric layer structure and having openings are formed in the MEMS device region. The first dielectric layer structure located on the substrate and a vent hole layer located on the first dielectric layer structure and having a vent hole are formed in the vent hole region. After that, a sealing layer is formed on the diaphragm and seals the diaphragm. Next, a second metal interconnect structure is formed on the first metal interconnect structure. At the same time, a second dielectric layer structure is formed on the sealing layer in the MEMS device region and on the vent hole layer in the vent hole region. Thereafter, a hard mask layer is formed on the second metal interconnect structure. Then, the first dielectric layer structure and the second dielectric layer structure are removed by the use of the hard mask layer as a mask.

In the fabricating method of a structure of MEMS electroacoustic transducer according to another embodiment of the present invention, a material of the sealing layer is, for example, amorphous silicon or polysilicon.

In the fabricating method of a structure of MEMS electroacoustic transducer according to another embodiment of the present invention, a material of the hard mask layer is, for example, a silicon material or a metal material.

In the fabricating method of a structure of MEMS electroacoustic transducer according to another embodiment of the present invention, when forming the first metal interconnect structure and the second metal interconnect structure, the method further includes forming a protection ring structure between the circuit region and the MEMS device region and between the MEMS device region and the vent hole region.

In view of the above, the structure of MEMS electroacoustic transducer of the present invention adopts a silicon material layer as the sealing layer, thus effectively improving the sensitivity of the MEMS electroacoustic transducer.

Furthermore, the fabricating method of a structure of MEMS electroacoustic transducer of the present invention can effectively control the film quality of the sealing layer, thereby fabricating the sealing layer of good quality.

On the other hand, in the fabricating method of a structure of MEMS electroacoustic transducer of the present invention, since the step of forming the sealing layer is performed before removing the first dielectric layer structure and second dielectric layer structure, the method of the present invention can be easily integrated with the current semiconductor process, and achieve the effect of simplifying the process.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
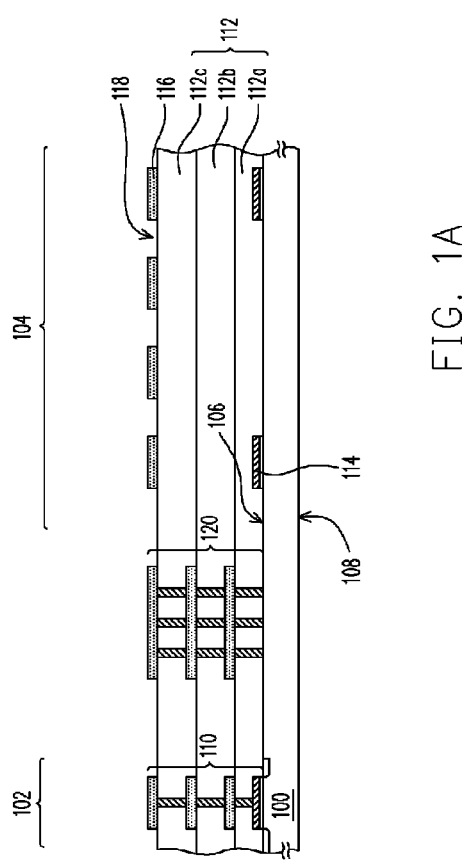
FIGS. 1A to 1D are cross-sectional views illustrating processes of fabricating a structure of MEMS electroacoustic transducer according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1D are cross-sectional views illustrating processes of fabricating a structure of micro-electro-mechanical systems (MEMS) electroacoustic transducer according to a first embodiment of the present invention.

First, referring to FIG. 1A, a substrate 100 is provided. The substrate 100 includes a circuit region 102 and an MEMS device region 104. The substrate 100 has a front side 106 and a back side 108. The substrate 100 is, for example, a silicon substrate. Wherein, one of the ordinary skill in the art could modulate the disposition relationship between the circuit region 102 and the MEMS device region 104 depended on demand. For example, the MEMS device region 104 is located at the right side of the circuit region 102 in the first embodiment. In other embodiment, the MEMS device region 104 may be located at the left side of the circuit region 102.

Then, a metal interconnect structure 110 is formed on the front side 106 of the substrate 100 in the circuit region 102. The fabricating method of the metal interconnect structure 110 is known to persons of ordinary skill in the art, and the details will not be described herein again.

When the metal interconnect structure 110 is formed, a dielectric layer structure 112, conductive patterns 114, and a diaphragm 116 are formed in the MEMS device region 104. The conductive patterns 114 and the diaphragm 116 may be used as the lower and upper electrodes of the capacitive electroacoustic transducer, respectively.

The dielectric layer structure 112 is located at the front side 106 of the substrate 100. In this embodiment, the dielectric layer structure 112 is, for example, constituted of three dielectric layers 112a, 112b, 112c, but the present invention will not be limited to this. The material of the dielectric layer structure 112 is, for example, silicon oxide. The dielectric layer structure 112 is, for example, formed when a dielectric layer in the metal interconnect structure 110 is formed.

The conductive patterns 114 are located in the dielectric layer structure 112. The material of the conductive patterns 114 is, for example, a metal material such as copper, or doped polysilicon. The conductive patterns 114 are, for example, formed when a gate of a transistor in the metal interconnect structure 110 or a metal interconnect layer is formed.

The diaphragm 116 is located on the dielectric layer structure 112 and has openings 118. The diaphragm 116 is in a shape of, for example, net. The material of the diaphragm 116 is, for example, a metal material such as copper. The diaphragm 116 is, for example, formed when the metal interconnect layer in the metal interconnect structure 110 is formed.

Furthermore, when the metal interconnect structure 110 is formed, a protection ring structure 120 may be optionally formed between the circuit region 102 and the MEMS device region 104, and is used for protecting a dielectric layer located in the circuit region 102 in the subsequent process of removing the dielectric material. The protection ring structure 120 is, for example, formed when the metal interconnect structure 110 is formed.

Figure 1B:
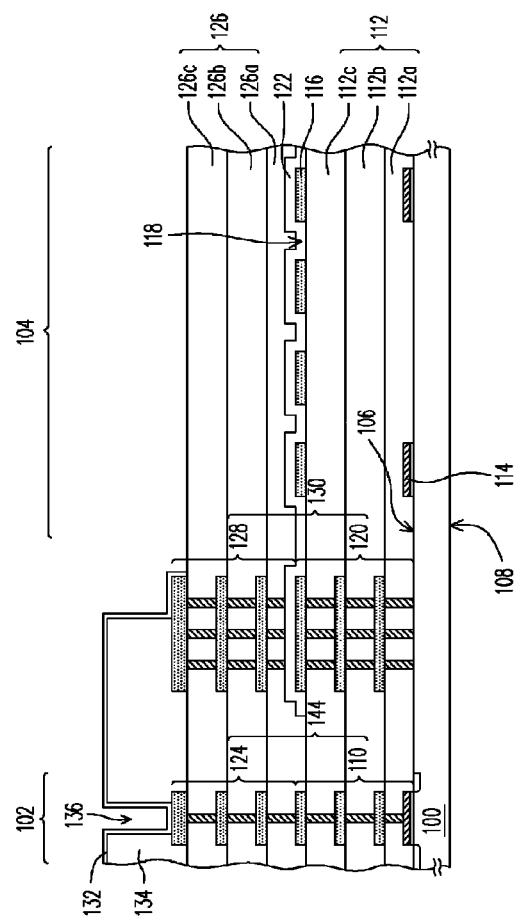

After that, referring to FIG. 1B, a sealing layer 122 is formed on the diaphragm 116 and seals the diaphragm 116. The material of the sealing layer 122 is, for example, a silicon material such as amorphous silicon or polysilicon. When the material of the sealing layer 122 is the silicon material, the sensitivity of the MEMS electroacoustic transducer is improved. The forming method of the sealing layer 122 includes, for example, first forming a sealing material layer to cover the diaphragm 116 by means of chemical vapor deposition, and performing a patterning process on the sealing material layer to remove the sealing material layer outside the MEMS device region 104. Furthermore, in accordance with the requirements of device design, the sealing layer 122 may be optionally formed on the protection ring structure 120.

Next, a metal interconnect structure 124 is formed on the metal interconnect structure 110. The metal interconnect structure 110 and the metal interconnect structure 124 constitute a metal interconnect structure 144. The fabricating method of the metal interconnect structure 124 is known to persons of ordinary skill in the art, and the details will not be described herein again.

When the metal interconnect structure 124 is formed, a dielectric layer structure 126 is formed on the sealing layer 122 in the MEMS device region 104. In this embodiment, the dielectric layer structure 126 is, for example, constituted of three dielectric layers 126a, 126b, 126c, but the present invention will not be limited to this. The material of the dielectric layer structure 126 is, for example, silicon oxide. The dielectric layer structure 126 is, for example, formed when the dielectric layer in the metal interconnect structure 124 is formed.

Furthermore, when the metal interconnect structure 124 is formed, a protection ring structure 128 may be optionally formed between the circuit region 102 and the MEMS device region 104, and is used for protecting the dielectric layer located in the circuit region 102 in the subsequent process of removing the dielectric material. The protection ring structure 128 and the protection ring structure 120 constitute a protection ring structure 130. The protection ring structure 128 may be, for example, formed when the metal interconnect structure 124 is formed.

Thereafter, a hard mask layer 132 is formed on the metal interconnect structure 124, and exposes the dielectric layer structure 126 in the MEMS device region 104, for protecting the dielectric layer located in the circuit region 102 in the subsequent process of removing the dielectric material. The material of the hard mask layer 132 is, for example, a silicon material such as amorphous silicon or polysilicon, or a metal material such as aluminum. The forming method of the hard mask layer 132 includes, for example, first forming a hard mask material layer to cover the metal interconnect structure 124 by means of deposition, and performing a patterning process on the hard mask material layer to expose the dielectric layer structure 126 in the MEMS device region 104. Furthermore, in accordance with the requirements of device design, the hard mask layer 132 may be optionally formed on the protection ring structure 128.

In addition, the dielectric layer 134 may be optionally formed on the metal interconnect structure 124 and the protection ring structure 128 before forming the hard mask layer 132. The dielectric layer 134 is, for example, formed with contact openings 136. The dielectric layer 134 may be a single layer or multiplayer structure, and the material thereof is, for example, silicon oxide or silicon nitride.

Figure 1C:
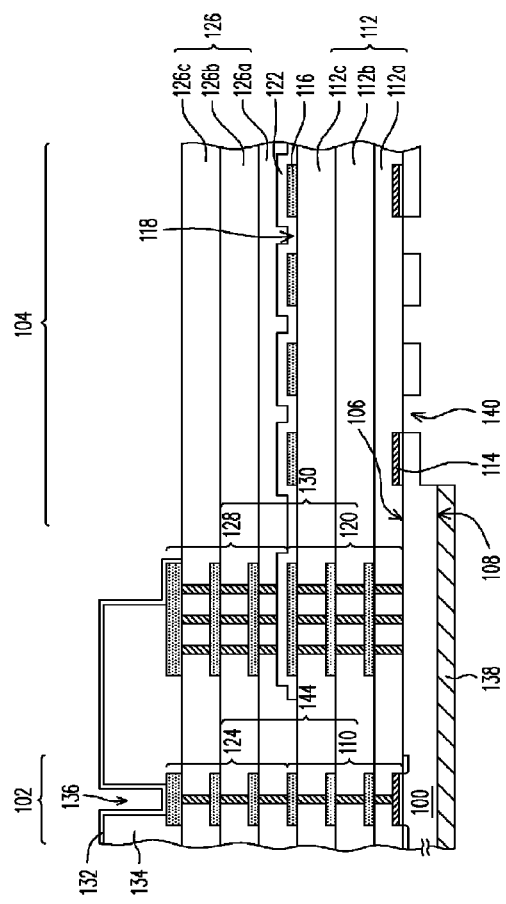

Then, referring to FIG. 1C, a hard mask layer 138 is formed on the back side 108 of the substrate 100 in the circuit region 102, and exposes the back side 108 of the substrate 100 in the MEMS device region 104, for protecting the substrate 100 located in the circuit region 102 in the subsequent process of removing the dielectric material.

The material of the hard mask layer 138 is, for example, a metal material such as aluminum. The forming method of the hard mask layer 138 includes, for example, forming a hard mask material layer to cover the entire substrate 100 by means of deposition, and performing a patterning process on the hard mask material layer to expose the back side 108 of the substrate 100 in the MEMS device region 104. Furthermore, in accordance with the requirements of device design, the hard mask layer 138 may be optionally formed on the back side 108 of the substrate 100 beneath the protection ring structure 128.

Afterwards, vent holes 140 are formed in the substrate 100 in the MEMS device region 104. The forming method of the vent holes 140 include, for example, performing a patterning process on the substrate 100 in the MEMS device region 104 from the back side 108 of the substrate 100, so as to remove a portion of the substrate 100.

Figure 1D:
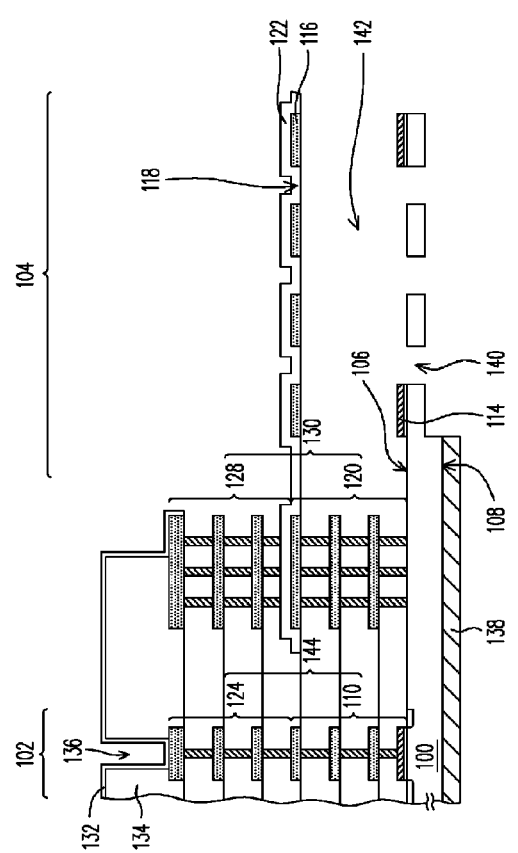

After that, referring to FIG. 1D, the dielectric layer structure 112 and the dielectric layer structure 126 are removed by the use of the hard mask layer 132 and the hard mask layer 138 as the mask, and a cavity 142 is formed between the diaphragm 116 and the substrate 100. The dielectric layer structure 112 and the dielectric layer structure 126 are removed by, for example, a wet-etching process, and the etchant is, for example, vapor hydrofluoric acid (VHF).

Seen from the above first embodiment, the fabricating method of a structure of MEMS electroacoustic transducer may effectively control the film quality of the sealing layer 122, thereby fabricating the sealing layer 122 of good quality.

Furthermore, in the above fabricating method of a structure of MEMS electroacoustic transducer, the step of forming the sealing layer 122 is performed before removing the dielectric layer structure 112 and the dielectric layer structure 126, and thus the method of the present invention can be easily integrated with the current semiconductor process, and achieve the effect of simplifying the process.

Figure 2A:
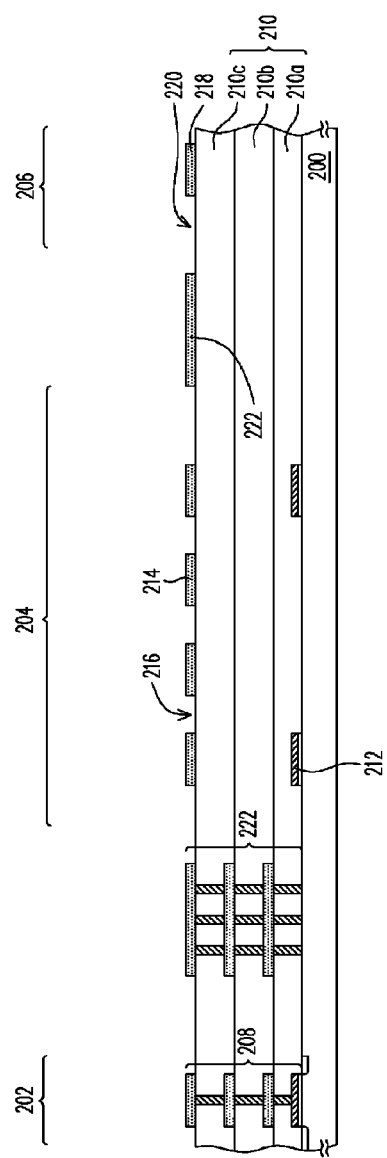
FIGS. 2A to 2C are cross-sectional views illustrating processes of fabricating a structure of MEMS electroacoustic transducer according to a second embodiment of the present invention.
Figure 2B:
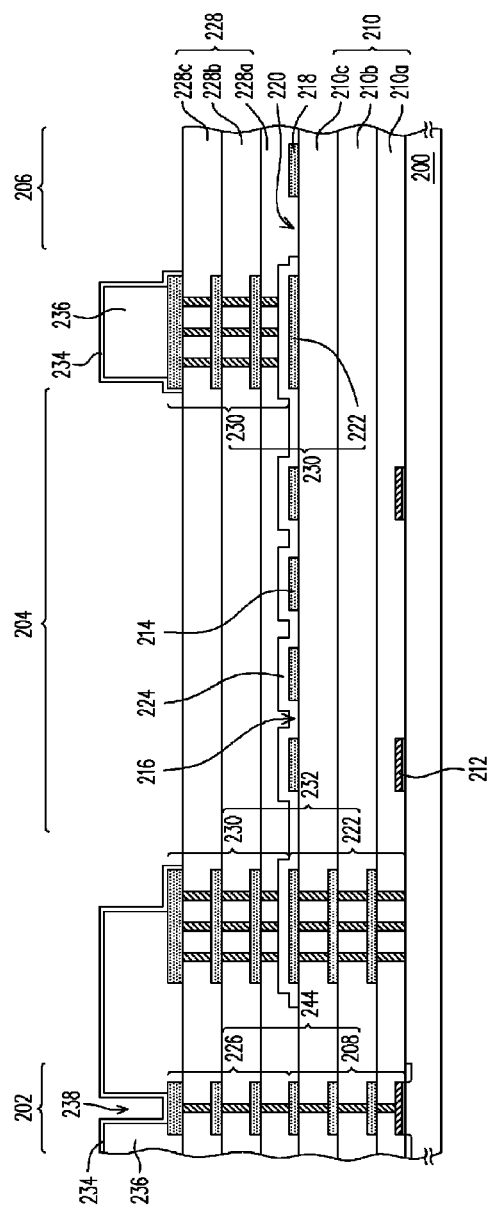
Figure 2C:
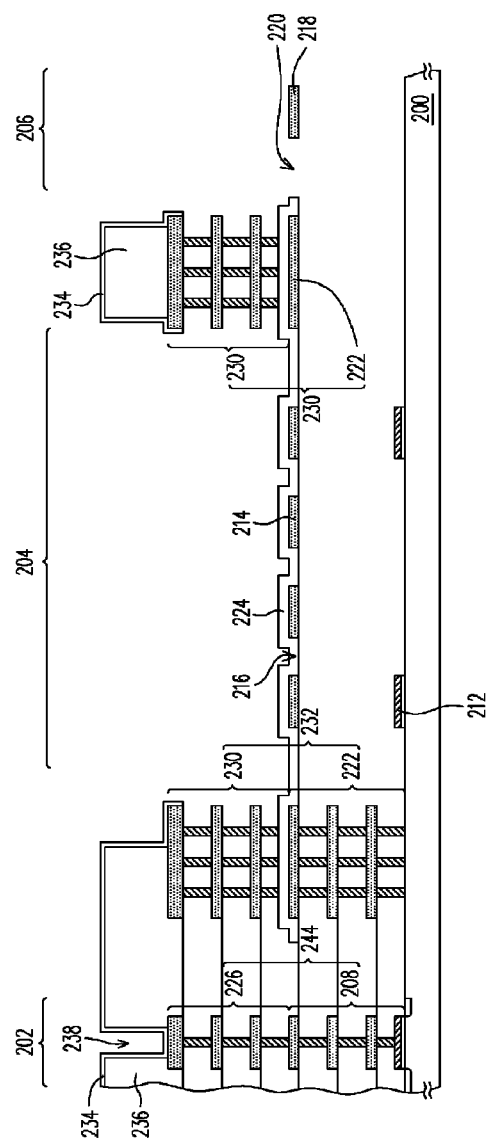

FIGS. 2A to 2C are cross-sectional views illustrating processes of fabricating a structure of MEMS electroacoustic transducer according to a second embodiment of the present invention.

First, referring to FIG. 2A, a substrate 200 is provided. The substrate 200 includes a circuit region 202, an MEMS device region 204, and a vent hole region 206. The substrate 200 is, for example, a silicon substrate. Wherein, one of the ordinary skill in the art could modulate the disposition relationship among the circuit region 202, the MEMS device region 204 and the vent hole region 206 depended on demand. For example, the circuit region 202 is located at one side of the MEMS device region 204, and the vent hole region 206 is located at the other side of the MEMS device region 204 in the second embodiment. In other embodiment, the circuit region 202 may be located at one side of the vent hole region 206, and the MEMS device region 204 may be located at the other side of the vent hole region 206.

Then, a metal interconnect structure 208 is formed on the substrate 200 in the circuit region 202. The fabricating method of the metal interconnect structure 208 is known to persons of ordinary skill in the art, and the details will not be described herein again.

When the metal interconnect structure 208 is formed, a dielectric layer structure 210, conductive patterns 212, and a diaphragm 214 are formed in the MEMS device region 204. The conductive patterns 212 and the diaphragm 214 may be used as the lower and upper electrodes of the capacitive electroacoustic transducer, respectively.

The dielectric layer structure 210 is located on the substrate 200 in the MEMS device region 204. In this embodiment, the dielectric layer structure 210 is, for example, constituted of three dielectric layers 210a, 210b, 210c, but the present invention will not be limited to this. The material of the dielectric layer structure 210 is, for example, silicon oxide. The dielectric layer structure 210 is, for example, formed when dielectric layer in the metal interconnect structure 208 is formed.

The conductive patterns 212 are located in the dielectric layer structure 210. The material of the conductive patterns 212 is, for example, a metal material such as copper, or doped polysilicon. The conductive patterns 212 are, for example, formed when a gate of a transistor in the metal interconnect structure 208 or a metal interconnect layer is formed.

The diaphragm 214 is located on the dielectric layer structure 210 and has openings 216. The diaphragm 214 is in a shape of, for example, net. The material of the diaphragm 214 is, for example, a metal material such as copper. The diaphragm 214 is, for example, formed when the metal interconnect layer in the metal interconnect structure 208 is formed.

Furthermore, when the metal interconnect structure 208 is formed, a dielectric layer structure 210 and a vent hole layer 218 are formed in the vent hole region 206. The dielectric layer structure 210 when being formed in the MEMS device region 204 may be formed on the substrate 200 in the vent hole region 206 at the same time.

The vent hole layer 218 is located at on dielectric layer structure 210 and has a vent hole 220. The material of the vent hole layer 218 is, for example, a metal material such as copper. The vent hole layer 218 is, for example, formed when the metal interconnect layer in the metal interconnect structure 208 is formed.

On the other hand, when the metal interconnect structure 208 is formed, a protection ring structure 222 may be optionally formed between the circuit region 202 and the MEMS device region 204 and between the MEMS device region 204 and the vent hole region 206, and is used for protecting the dielectric layer located in the circuit region 202 in the subsequent process of removing the dielectric material. The protection ring structure 222 is, for example, formed when the metal interconnect structure 208 is formed.

After that, referring to FIG. 2B, a sealing layer 224 is formed on the diaphragm 214 and seals the diaphragm 214. The material of the sealing layer 224 is, for example, a silicon material such as amorphous silicon or polysilicon. When the material of the sealing layer 224 is the silicon material, the sensitivity of the MEMS electroacoustic transducer is improved. The forming method of the sealing layer 224 includes, for example, first forming a sealing material layer to cover the diaphragm 214 by means of chemical vapor deposition, and performing a patterning process on the sealing material layer to remove the sealing material layer outside the MEMS device region 204. Furthermore, in accordance with the requirements of device design, the sealing layer 224 may be optionally formed on the protection ring structure 222.

Next, a metal interconnect structure 226 is formed on the metal interconnect structure 208. The metal interconnect structure 208 and the metal interconnect structure 226 constitute a metal interconnect structure 244. The fabricating method of the metal interconnect structure 226 is known to persons of ordinary skill in the art, and the details will not be described herein again.

When the metal interconnect structure 226 is formed, a dielectric layer structure 228 is formed on the sealing layer 224 in the MEMS device region 204 and on the vent hole layer 218 in the vent hole region 206. In this embodiment, the dielectric layer structure 228 is, for example, constituted of three dielectric layers 228a, 228b, 228c, but the present invention will not be limited to this. The material of the dielectric layer structure 228 is, for example, silicon oxide. The dielectric layer structure 228 is, for example, formed when the dielectric layer in the metal interconnect structure 226 is formed.

Furthermore, when the metal interconnect structure 226 is formed, a protection ring structure 230 may be optionally formed between the circuit region 202 and the MEMS device region 204 and between the MEMS device region 204 and the vent hole region 206, and is used for protecting the dielectric layer located in the circuit region 202 in the subsequent process of removing the dielectric material. The protection ring structure 230 and the protection ring structure 222 constitute a protection ring structure 232. The protection ring structure 230 may be, for example, formed when the metal interconnect structure 226 is formed.

Thereafter, a hard mask layer 234 is formed on the metal interconnect structure 226, and exposes the dielectric layer structure 228 in the MEMS device region 204 and the vent hole region 206, for protecting the dielectric layer located in the circuit region 202 in the subsequent process of removing the dielectric material.

The material of the hard mask layer 234 is, for example, a silicon material such as amorphous silicon or polysilicon, or a metal material such as aluminum. The forming method of the hard mask layer 234 includes, for example, first forming a hard mask material layer to cover the metal interconnect structure 234 by means of deposition, and performing a patterning process on the hard mask material layer to expose the dielectric layer structure 228 in the MEMS device region 204. Furthermore, in accordance with the requirements of device design, the hard mask layer 234 may be optionally formed on the protection ring structure 230.

In addition, a dielectric layer 236 may be optionally formed on the metal interconnect structure 226 and the protection ring structure 230 before forming the hard mask layer 234. The dielectric layer 236 is, for example, formed with contact openings 238. The dielectric layer 238 may be a single layer or multiplayer structure, and the material thereof is, for example, silicon oxide or silicon nitride.

Then, referring to FIG. 2C, the dielectric layer structure 210 and the dielectric layer structure 228 are removed by the use of the hard mask layer 234 as the mask, a cavity 240 is formed between the diaphragm 214 and the substrate 200, and a cavity 242 is formed between the vent hole layer 218 and the substrate 200. The cavity 240 is in communication with the cavity 242. The dielectric layer structure 210 and the dielectric layer structure 228 are removed by, for example, a wet-etching process, and the etchant is, for example, vapor hydrofluoric acid (VHF).

Seen from the above second embodiment, the fabricating method of a structure of MEMS electroacoustic transducer may fabricate the sealing layer 224 of good quality, and may be integrated with the current semiconductor process, and achieve the effect of simplifying the process.

Hereinafter, referring to FIGS. 1D and 2C, the structure of MEMS electroacoustic transducer according to a third embodiment and a fourth embodiment of the present invention is illustrated. It should be noted that in the structure of MEMS electroacoustic transducer of the third and fourth embodiments, the material of the sealing layer is the silicon material, that is, the sealing layer is a silicon material layer.

Referring to FIG. 1D, the structure of MEMS electroacoustic transducer according to the third embodiment includes a substrate 100, conductive patterns 114, a diaphragm 116 and a sealing layer 122. The substrate 100 includes an MEMS device region 104. The diaphragm 116 has openings 118, and is disposed in the MEMS device region 104. A cavity 142 is formed between the diaphragm 116 and the substrate 100. The sealing layer 122 is disposed on the diaphragm 116 and seals the diaphragm 116. The sealing layer 122 is a silicon material layer, and the material of the silicon material layer is, for example, amorphous silicon or polysilicon. The conductive patterns 114 are disposed beneath the diaphragm 116 in the MEMS device region 104.

Furthermore, the structure of MEMS electroacoustic transducer may further include vent holes 140 disposed in the substrate 100 in the MEMS device region 104. In addition, the structure of MEMS electroacoustic transducer optionally includes a protection ring structure 130 disposed at at least one side of the MEMS device region 104. In this embodiment, the protection ring structure 130 is disposed between the circuit region 102 and the MEMS device region 104, for example.

However, since the details of the materials, effects, and forming methods of the components of the structure of MEMS electroacoustic transducer in FIG. 1D has been described in the first embodiment, and will not be described herein again.

Seen from the third embodiment, since the sealing layer 122 in the structure of MEMS electroacoustic transducer is a silicon material layer, the response speed of the sealing layer 122 is quick, thereby effectively improving the sensitivity of the MEMS electroacoustic transducer.

Referring to FIG. 2C, the structure of MEMS electroacoustic transducer according to the fourth embodiment includes a substrate 200, conductive patterns 212, a diaphragm 214 and a sealing layer 224. The substrate 200 includes an MEMS device region 204. The diaphragm 214 has openings 216 and is disposed in the MEMS device region 204. A cavity 240 is formed between the diaphragm 214 and the substrate 200. The sealing layer 224 is disposed on the diaphragm 214 and seals the diaphragm 214. The sealing layer 224 is a silicon material layer, and the material of the silicon material layer is, for example, amorphous silicon or polysilicon. The conductive pattern 212 are disposed beneath the diaphragm 214 in the MEMS device region 204.

Furthermore, the structure of MEMS electroacoustic transducer may further includes a vent hole region 206 and a vent hole layer 218. The vent hole region 206 is in communication with the MEMS device region 204, and the vent hole layer 218 has a vent hole 220, and is disposed in the vent hole region 206. A cavity 242 is formed between the vent hole layer 218 and the substrate 200, and the cavity 242 is in communication with the cavity 240. In addition, the structure of MEMS electroacoustic transducer optionally includes a protection ring structure 232 disposed at at least one side of the MEMS device region 204. In this embodiment, the protection ring structure 232 is disposed between the circuit region 202 and the MEMS device region 204 and between the MEMS device region 204 and the vent hole region 206.

However, since the details of the materials, effects, and forming methods of the components of the structure of MEMS electroacoustic transducer in FIG. 2C has been described in the first embodiment, and will not be described herein again.

Seen from the fourth embodiment, since the sealing layer 224 in the structure of MEMS electroacoustic transducer is a silicon material layer, the response speed of the sealing layer 224 is quick, thereby effectively improving the sensitivity of the MEMS electroacoustic transducer.

To sum up, the above embodiments at least have the following advantages.
1. The structure of MEMS electroacoustic transducer in the above embodiments can effectively improve the sensitivity of the MEMS electroacoustic transducer.
2. The fabricating method of a structure of MEMS electroacoustic transducer in the above embodiments can be used to fabricate the sealing layer of good quality.
3. The fabricating method of a structure of MEMS electroacoustic transducer in the above embodiments can be easily integrated with the current semiconductor process, and achieve the effect of simplifying the process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A structure of micro-electro-mechanical systems (MEMS) electroacoustic transducer, comprising:
a substrate, comprising a MEMS device region;
a vent hole disposed in the substrate in the MEMS device region, wherein the vent hole penetrates through both a front side and a backside of the substrate;
a diaphragm, having openings and disposed on the MEMS device region, wherein a first cavity is formed between the diaphragm and the substrate and connected to the vent hole in the substrate;
a silicon material layer, disposed on the diaphragm and sealing the diaphragm;
a conductive pattern, disposed beneath the diaphragm and on the MEMS device region, wherein a top surface of the conductive pattern is exposed by the first cavity; and
a first protection ring structure and a second protection ring structure adjacent to the MEMS device region, wherein a top surface of the first protection ring structure and a top surface of the diaphragm are coplanar, the silicon material layer is disposed on the first protection ring structure, and a bottom surface of the silicon material layer, a bottom surface of the diaphragm, and a bottom surface of the first protection ring structure are coplanar.

2. The structure of MEMS electroacoustic transducer according to claim 1, wherein a material of the diaphragm comprises a metal material.

3. The structure of MEMS electroacoustic transducer according to claim 1, wherein the diaphragm is in a shape of net.

4. The structure of MEMS electroacoustic transducer according to claim 1, wherein a material of the silicon material layer is amorphous silicon or polysilicon.

5. The structure of MEMS electroacoustic transducer according to claim 1, further comprising a vent hole region being in communication with the MEMS device region.

6. The structure of MEMS electroacoustic transducer according to claim 5, further comprising a vent hole layer having a vent hole and disposed in the vent hole region, wherein a second cavity is formed between the vent hole layer and the substrate, and the second cavity is in communication with the first cavity.

7. The structure of MEMS electroacoustic transducer according to claim 6, wherein a material of the vent hole layer comprises a metal material.

8. The structure of MEMS electroacoustic transducer according to claim 5, further comprising a protection ring structure disposed at at least one side of the MEMS device region.

* * * * *